US008468402B2

(12) United States Patent
Maeda et al.

(10) Patent No.: US 8,468,402 B2
(45) Date of Patent: Jun. 18, 2013

(54) TEST CIRCUIT INCLUDING TAP CONTROLLER SELECTIVELY OUTPUTTING TEST SIGNAL BASED ON MODE AND SHIFT SIGNALS

(75) Inventors: Toshiyuki Maeda, Kanagawa (JP);
Yoshiyuki Nakamura, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 715 days.

(21) Appl. No.: 12/654,801

(22) Filed: Jan. 5, 2010

(65) Prior Publication Data
US 2010/0174958 A1 Jul. 8, 2010

(30) Foreign Application Priority Data
Jan. 6, 2009 (JP) ................................. 2009-000743

(51) Int. Cl.
*G01R 31/3177* (2006.01)
(52) U.S. Cl.
USPC .......................................... 714/727; 714/733
(58) Field of Classification Search
None
See application file for complete search history.

(56) References Cited

U.S. PATENT DOCUMENTS

| 5,355,369 | A | * | 10/1994 | Greenberger et al. | ........ 714/727 |
| 5,644,580 | A | * | 7/1997 | Champlin | ..................... 714/733 |
| 6,073,254 | A | * | 6/2000 | Whetsel | .......................... 714/30 |
| 2004/0163012 | A1 | | 8/2004 | Hayase | |
| 2007/0226558 | A1 | | 9/2007 | Ikeda et al. | |
| 2008/0281547 | A1 | * | 11/2008 | Nakamura et al. | ............. 702/120 |
| 2011/0209016 | A1 | * | 8/2011 | Whetsel | ........................ 714/727 |

FOREIGN PATENT DOCUMENTS

| JP | 2001-203322 | | 7/2001 |
| JP | 2004-164367 | | 6/2004 |
| JP | 2006-189305 | | 7/2006 |
| JP | 2007-148754 | | 6/2007 |
| JP | 2007-271390 | | 10/2007 |
| KR | 2007015984 | A * | 2/2007 |

OTHER PUBLICATIONS

Dahbura et al., An Optimal Test sequence for the JTAG/IEEE P1149.1 Test Access Port Controller, 1989, IEEE International Test Conference, Proceedings, pp. 55-62.*
Mitra et al., Design for Testability and Testing of IEEE 1149.1 Tap Controller, 2002, Proceedings of the 20th IEEE VLSI Test Symposium, pp. 247-252.*

* cited by examiner

*Primary Examiner* — Ajay Bhatia
*Assistant Examiner* — Dipakkumar Gandhi
(74) *Attorney, Agent, or Firm* — McGinn IP Law Group, PLLC

(57) ABSTRACT

A test circuit includes a plurality of TAP controllers conforming to a standard specification defined in IEEE 1149 and includes a master TAP controller which receives a control code and a test control signal and performs a test on a circuit to be tested and which outputs a shift mode signal, a first slave TAP controller which receives the control code and the test control signal and performs a test on a circuit to be tested, and a first TAP pin control circuit provided to correspond to the first slave TAP controller and which switches between inputting the control code to the first slave TAP controller from the outside and inputting the control code through the master TAP controller, on the basis of the shift mode signal.

12 Claims, 9 Drawing Sheets

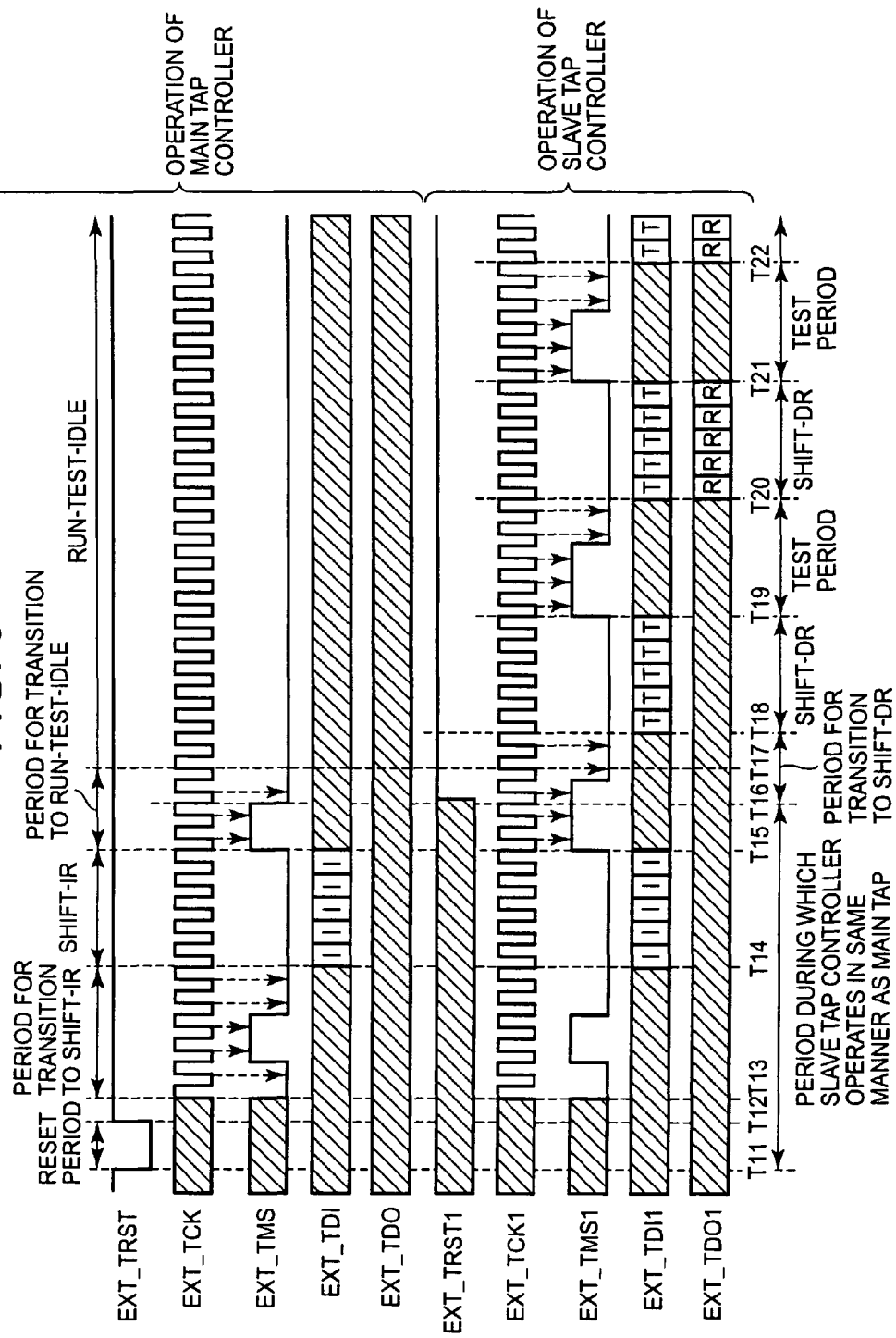

TEST CIRCUIT INCLUDING TAP CONTROLLER SELECTIVELY OUTPUTTING TEST SIGNAL BASED ON MODE AND SHIFT SIGNALS

INCORPORATION BY REFERENCE

This application is based upon and claims the benefit of priority from Japanese Patent Application No. 2009-000743 which was filed on Jan. 6, 2009, the disclosure of which is incorporated herein in its entirety by reference.

BACKGROUND OF THE INVENTION

1. Field of the Invention

The present invention relates to a test circuit and, more particularly, to a test circuit including a TAP (Test Access Port) controller defined in IEEE 1149.

2. Description of Related Art

The circuit scales of semiconductor devices have recently increased, and the number of ports for testing a semiconductor device is showing a tendency to increase. If the number of ports increases, then a package becomes larger, which leads to the difficulty in size reduction. There is thus a call for a reduction in the number of ports. Under the circumstances, the IEEE (Institute of Electrical and Electronics Engineers) has established IEEE 1149 in order to reduce the number of test ports. According to IEEE 1149.1, which is a part of IEEE 1149, it is possible to test a semiconductor device using five ports and a TAP controller.

The five ports are referred to as a TDI port, a TRST port, a TCK port, a TMS port, and a TDO port, respectively. In the following description, one set of the TDI port, the TRST port, the TCK port, the TMS port, and the TDO port will be referred to as a group of test ports. The TAP controller includes a state machine, an instruction register, and a boundary scan register. The instruction register stores a control code for TAP controller, which is inputted from the TDI port. The boundary scan register stores a test pattern which is inputted from the TDI port. The state machine controls the operating state of the TAP controller on the basis of a TMS signal which is inputted from the TMS port.

If there are a plurality of circuits as a test target, then a plurality of TAP controllers are used according to the number of circuits to be tested. If there are a plurality of circuits to be tested, then the circuits to be tested may operate individually or a plurality of test blocks may operate in cooperation. Accordingly, if a plurality of TAP controllers are used, then the connection among boundary scan registers of the plurality of TAP controllers is changed according to the operation of circuits to be tested.

For example, the test circuits described in Patent Document 1, Patent Document 2, and Patent Document 3 are each capable of selecting which one of TAP controllers provided for respective circuits to be tested is to be actuated. With this configuration, the test circuits can perform an individual test only on one arbitrarily selected circuit to be tested. However, the test circuits described in Patent Documents 1 to 3 suffer from the problem of inability to switch a unit for circuits to be tested included in testing. To cope with this problem, Patent Document 4 discloses a test circuit capable of switching a unit for circuits for a test target included in testing.

The test circuit described in Patent Document 4 includes selection circuits in one TAP controller. The selection circuits are arranged to divide a plurality of boundary scan registers into groups. Each selection circuit switches between transmitting, to boundary scan registers connected at a subsequent stage, a test pattern which is transmitted through boundary scan registers connected at a previous stage and transmitting, to the boundary scan registers connected at the subsequent stage, the test pattern which is transmitted through a path bypassing the boundary scan registers connected at the previous stage. With this configuration, the test circuit described in Patent Document 4 can adjust the length of a boundary scan chain composed of boundary scan registers according to the length of a test pattern. Since the test circuit described in Patent Document 4 has a circuit to be tested provided for each of scan chains divided by the selection circuits, the test circuit can change the number of circuits to be tested which can be tested using one test pattern.

The test circuit disclosed in Patent Document 5 has boundary scan chains connected in parallel and a converter which outputs a digital value on the basis of the voltage value of a multilevel signal (analog signal) inputted from the outside. The converter outputs a digital value to each of the boundary scan chains when one multilevel signal is inputted. With this configuration, the test circuit disclosed in Patent Document 5 shortens the time required for a test pattern to be inputted or outputted from or to each boundary scan chain.

[Patent Document 1] Japanese Patent Laid-Open No. 2004-164367

[Patent Document 2] Japanese Patent Laid-Open No. 2007-148754

[Patent Document 3] Japanese Patent Laid-Open No. 2007-271390

[Patent Document 4] Japanese Patent Laid-Open No. 2001-203322

[Patent Document 5] Japanese Patent Laid-Open No. 2006-189305

SUMMARY

However, the test circuits described in Patent Documents 1 to 5 are incapable of controlling the connection state among a plurality of TAP controllers. That is, the test circuits are incapable of switching between treating boundary scan registers in a plurality of TAP controllers as individual scan chains and treating the boundary scan registers in the plurality of TAP controllers as one scan chain composed of the boundary scan registers connected to each other. For this reason, although each of the test circuits described in Patent Documents 1 to 5 includes a plurality of TAP controllers, the test circuit suffers from the problem of a low degree of flexibility in combining circuits to be tested included in testing.

As one aspect according to the present invention, a test circuit includes a plurality of TAP controller conforming to a standard specification defined in IEEE 1149, a master TAP controller which receives a control code and a test control signal and performs a test on a circuit to be tested and which outputs a shift mode signal, a first slave TAP controller which receives the control code and the test control signal and performs a test on a circuit to be tested, and a first port control circuit provided to correspond to the first slave TAP controller and which switches between inputting the control code to be inputted to the first slave TAP controller from an outside and inputting the control code through the master TAP controller, on the basis of the shift mode signal.

In the test circuit according to the exemplary aspect, a master TAP controller outputs a shift mode signal. A first slave TAP controller can switch between inputting a control code from an outside and inputting the control code through the master TAP controller, on the basis of the shift mode signal. That is, the test circuit is capable of switching between treating a boundary scan register in the first slave TAP controller as an independent scan chain and connecting the boundary scan register in the first slave TAP controller to a boundary scan register in another TAP controller (e.g., the master TAP controller) and treating the connected boundary scan registers as one scan chain. Accordingly, the test circuit can arbitrarily set a test unit for circuits to be tested by switching the connection state among the TAP controllers. That is, the test circuit is capable of switching the connection state among a plurality of TAP controllers and achieving highly flexible testing.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 9 is a timing chart for the test circuit according to the first exemplary embodiment when the test circuit runs in the per-core test mode.

DETAILED DESCRIPTION OF THE EXEMPLARY EMBODIMENTS

First Exemplary Embodiment

Figure 1:
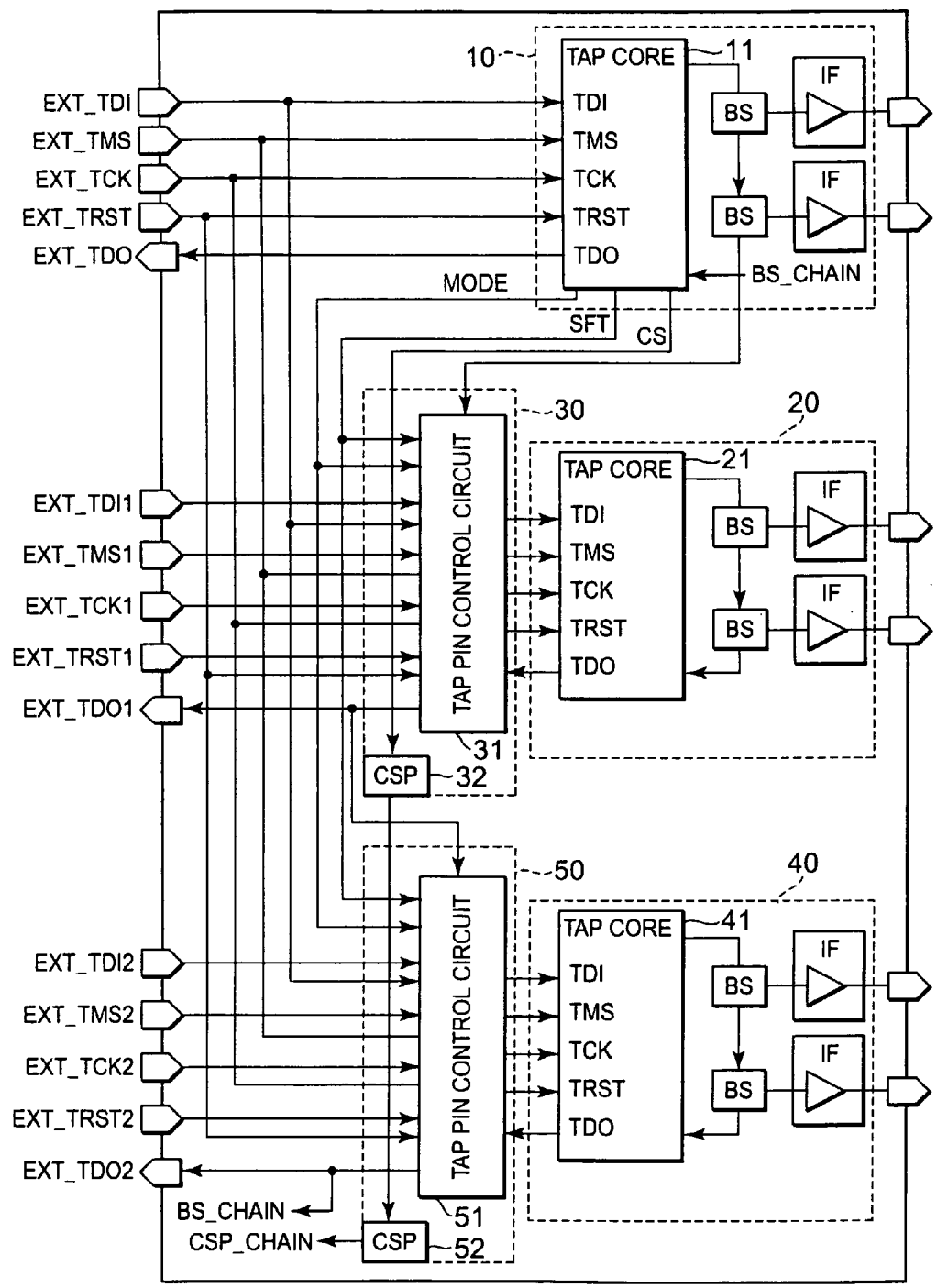
FIG. 1 is a block diagram of a test circuit according to a first exemplary embodiment.

FIG. 1 shows a block diagram of a test circuit according to a first exemplary embodiment. As shown in FIG. 1, the test circuit includes a master TAP controller 10, a first slave TAP controller 20, a second slave TAP controller 40, a first port control circuit 30, and a second port control circuit 50. The master TAP controller 10, the first slave TAP controller 20, and the second slave TAP controller 40 are each a TAP controller conforming to the IEEE 1149.1 standard. Accordingly, control codes and test control signals used in the test circuit are codes and signals within a range defined in the IEEE 1149.1 standard.

The test circuit also includes a group of test ports defined in IEEE 1149.1 (e.g., a TDI port, a TMS port, a TCK port, a TRST port, and a TDO port) to correspond to each of the TAP controllers. The TDI port is an input port for control codes. The TMS port, the TCK port, and the TRST port are input ports for test control signals (including a TMS signal, a TCK signal (clock signal), and a TRST signal (reset signal)). The TDO port is a port for outputting a test result or data stored in a boundary scan register and an instruction register in each TAP controller.

The test circuit is assumed to include a plurality of groups of test ports. The plurality of groups of test ports are provided to correspond to the TAP controllers. In the following description, a group of test ports shared by the plurality of TAP controllers in the test circuit will be referred to as a group of common test ports (EXT_TDI, EXT_TMS, EXT_TCK, EXT_TRST, and EXT_TDO), a group of test ports provided only for the first TAP controller 20 will be referred to as a group of first individual test ports (EXT_TDI1, EXT_TMS1, EXT_TCK1, EXT_TRST1, and EXT_TDO1), and a group of test ports provided only for the second TAP controller 40 will be referred to as a group of second individual test ports (EXT_TDI2, EXT_TMS2, EXT_TCK2, EXT_TRST2, and EXT_TDO2).

The master TAP controller 10 includes a TAP core 11, boundary scan registers BS, and interface circuits IF. An instruction register (not shown) is provided in the TAP core 11. The TAP core 11 receives a TDI signal, a TMS signal, a TCK signal, and a TRST signal conforming to IEEE 1149.1 and controls the TAP controller. The boundary scan registers BS are series-connected to each other. The boundary scan registers BS provided in one TAP controller constitute the smallest unit of a boundary scan chain. The TAP core 11 sets a test pattern supplied as the TDI signal in the boundary scan registers BS if the TAP controller is in a mode of setting data in the boundary scan registers BS. Each interface circuit IF outputs data stored in the boundary scan registers BS to outside the test circuit. The interface circuit IF also receives a test result obtained from a circuit to be tested from outside the test circuit and supplies the test result to the corresponding boundary scan register BS.

The TAP core 11 outputs an operation mode setting signal MODE, a shift mode signal SFT, and a chip select signal CS on the basis of a control code supplied as the TDI signal.

Note that the TAP core 11 receives, as a boundary scan chain BS_CHAIN signal, a TDO signal outputted from the other TAP controller and uses the signal as a TDO signal to be outputted from the TAP core 11. In the main TAP controller 10, an output from a boundary scan chain is assumed to be outputted to the other TAP controllers without passing through the TAP core 11. However, the main TAP controller 10 may also be configured such that an output from the boundary scan chain is outputted through the TAP core 11.

The first slave TAP controller 20 includes a TAP core 21, boundary scan registers BS, and interface circuits IF. The TAP core 21 is obtained by removing the function of outputting the operation mode setting signal MODE, the shift mode signal SFT, and the chip select signal CS from the TAP core 11. The TAP core 21 receives an output from the boundary scan registers BS in the first slave TAP controller 20 and outputs it as a TDO signal to the outside. Since the boundary scan registers BS and the interface circuits IF are the same as those in the master TAP controller, and a description thereof will be omitted.

The first port control circuit 30 includes a TAP pin control circuit 31 and a CSP register 32. The TAP pin control circuit 31 switches between inputting a control code to be inputted to the first slave TAP controller 20 from the outside and inputting a control code through the boundary scan registers BS of the master TAP controller 10, on the basis of the shift mode signal SFT. The TAP pin control circuit 31 also switches between supplying test control signals and a control code from the group of common test ports to the first slave TAP controller 20 and supplying test control signals and a control code from the group of first individual test ports, on the basis of the operation mode setting signal MODE.

If the operation mode setting signal MODE indicates a common operation mode (e.g., "0"), and the shift mode signal SFT indicates a chain mode (e.g., "0"), then the TAP pin control circuit 31 supplies a control code outputted from the boundary scan chain of the master TAP controller 10 to the first slave TAP controller 20. If the operation mode setting signal MODE indicates the common operation mode, and the shift mode signal SFT indicates an independent mode (e.g., "1"), then the TAP pin control circuit 31 supplies a control code inputted from the TDI port (EXT_TDI) of the group of common test ports to the first slave TAP controller 20. If the operation mode setting signal MODE indicates an independent operation mode (e.g., "1"), then the TAP pin control circuit 31 supplies a control code inputted from the TDI port (EXT_TDI1) included in the group of first individual test ports to the first slave TAP controller 20, regardless of the value of the shift mode signal SFT.

The CSP register 32 stores the value of the chip select signal CS and stores a flag indicating whether to enable the first port control circuit 30. The CSP register 32 is series-connected to a CSP register provided in another port control circuit, and the CSP registers constitute a CSP chain CSP_CHAIN. The master TAP controller 10 generates the chip select signal CS as serial data. For example, if a value indicating that the first port control circuit is enabled is set in each CSP register, then the chip select signal becomes serial data having a sequence of ones, the number of which is equal to the number of CSP registers.

Since the second TAP controller 40 is substantially the same as the first TAP controller 20, and a description thereof will be omitted. The second port control circuit 50 includes a TAP pin control circuit 51 and a CSP register 52. The TAP pin control circuit 51 switches between inputting a control code to be inputted to the second slave TAP controller 40 from the outside and inputting a control code through the boundary scan registers BS of the first slave TAP controller 20, on the basis of the shift mode signal SFT. The TAP pin control circuit 51 also switches between supplying test control signals and a control code from the group of common test ports to the second slave TAP controller 40 and supplying test control signals and a control code from the group of second individual test ports, on the basis of the operation mode setting signal MODE. Note that since the operation of the TAP pin control circuit 51 for the operation mode setting signal MODE and the shift mode signal SFT is the same as that of the TAP pin control circuit 31, and a description thereof will be omitted. The CSP register 52 is substantially the same as the CSP register 32, and thus a description thereof will be omitted.

Figure 2:
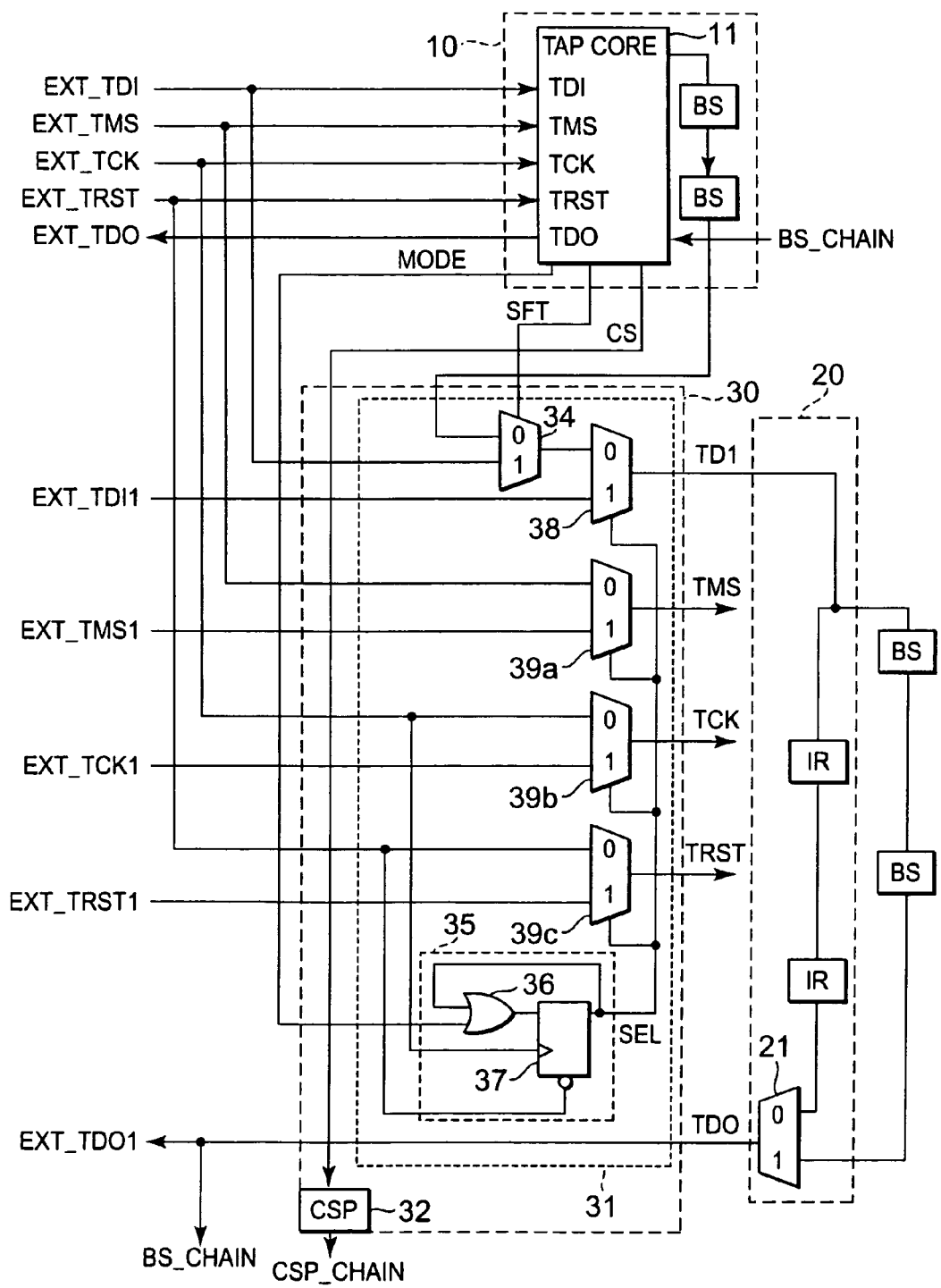
FIG. 2 is a detailed block diagram of a port control circuit according to the first exemplary embodiment.

The TAP pin control circuit 31 and the TAP pin control circuit 51 will be described in further detail. FIG. 2 shows a detailed block diagram of the TAP pin control circuit 31. Note that the master TAP controller 10 and the first slave TAP controller 20 are shown in FIG. 2 in order to describe the TAP pin control circuit 31. Note that instruction registers IR and a selector 21 are shown in the first slave TAP controller 20 in FIG. 2. Of a control code, an instruction code used to control the TAP controller is stored in the instruction registers IR. The selector 21 selects and outputs one of an instruction code stored in the instruction registers IR and test pattern data stored in the boundary scan registers BS according to the state of the TAP controller.

As shown in FIG. 2, the TAP pin control circuit 31 includes a first data path switching circuit (e.g., a selector 34), a first mode control circuit 35, a first code input switching circuit (e.g., a selector 38), and a plurality of first control input switching circuits (e.g., selectors 39a to 39c).

The selector 34 receives the shift mode signal SFT and switches between outputting a control code outputted from the boundary scan registers BS in the master TAP controller and outputting a control code inputted from the EXT_TDI port, which is one of the common test ports.

The first mode control circuit 35 holds the value of the operation mode setting signal MODE and outputs the held value as an input switching signal SEL. The first mode control circuit 35 includes an OR circuit 36 and a D flip-flop circuit 37. The operation mode setting signal MODE is inputted to one input port of the OR circuit 36 while an output from the D flip-flop circuit 37 is inputted to the other input port. The OR circuit 36 outputs the logical OR between two inputs. A clock signal is inputted from the EXT_TCK port of the group of common test ports to a clock input of the D flip-flop circuit 37 while an output from the OR circuit 36 is inputted to a data input port. The D flip-flop circuit 37 holds the signal level of a signal inputted to the data input port in synchronism with the rising edge of the clock signal and outputs a held value as the input switching signal SEL. A reset signal is inputted from the EXT_TRST port of the group of common test ports to a reset terminal of the D flip-flop circuit 37. An output from the D flip-flop circuit 37 becomes low level when the reset signal is in a reset state (e.g., at low level).

The selector 38 selects and outputs one of a control code outputted from the selector 34 and a control code inputted from the EXT_TDI1 terminal of the group of first individual test ports, on the basis of the input switching signal SEL.

The selectors 39a to 39c each switch between test control signals inputted from the group of common test ports and test control signals inputted from the group of first individual test ports, on the basis of the input switching signal SEL, and outputs the test control signals. More specifically, the selector 39a selects one of the TMS signal inputted from the EXT_TMS port and a TMS signal inputted from the EXT_TMS1 port and outputs the one to the first slave TAP controller 20. The selector 39b selects one of the clock signal inputted from the EXT_TCK port and a clock signal inputted from the EXT_TCK1 port and outputs the one to the first slave TAP controller 20. The selector 39c selects one of the reset signal inputted from the EXT_TRST port and a reset signal inputted from the EXT_TRST1 port and outputs the one to the first slave TAP controller 20.

Note that an output signal outputted from the first slave TAP controller 20 is outputted from the EXT_TDO1 port of the group of individual test ports without being processed in the first port control circuit 30.

Figure 3:
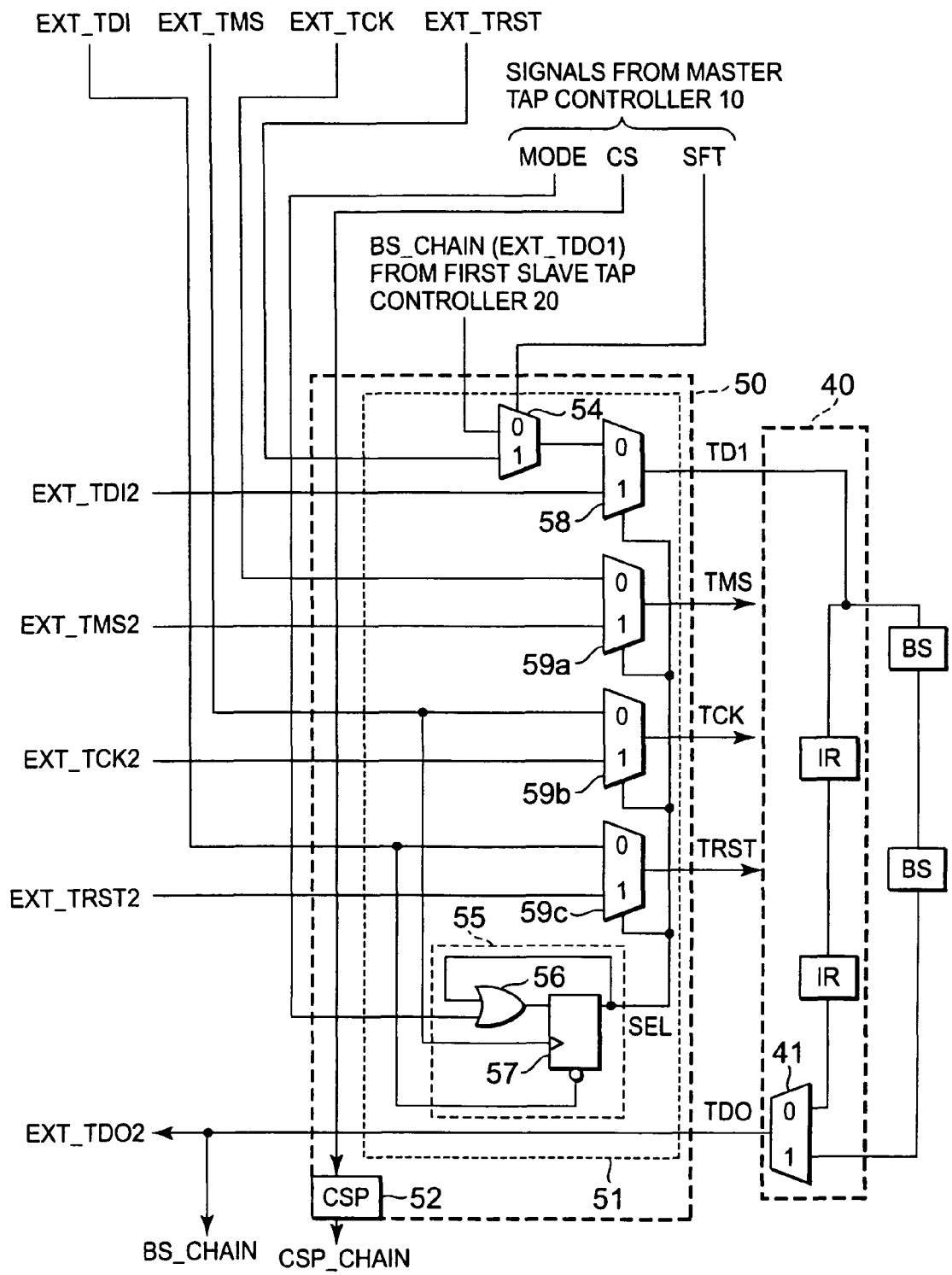
FIG. 3 is a detailed block diagram of a port control circuit according to the first exemplary embodiment.

FIG. 3 shows a block diagram of the second slave TAP controller 40. As shown in FIG. 3, the second slave TAP controller 40 is configured to receive a control code and test control signals from the second individual test ports. A selector 54 in the second slave TAP controller 40 is configured not to receive an output from the boundary scan registers BS in the master TAP controller 20 but to receive an output from the first slave TAP controller 20. The configuration of the remaining part of the second slave TAP controller 40 is substantially the same as that of a corresponding part of the first slave TAP controller 20.

Note that a second data path switching circuit (e.g., the selector 54) in the second slave TAP controller corresponds to the selector 34, a second mode control circuit 55 (including an OR circuit 56 and a D flip-flop circuit 57) corresponds to the first mode control circuit 35, a second code input switching circuit (e.g., a selector 58) corresponds to the selector 38, and a plurality of second control input switching circuits (e.g., selectors 59a to 59c) correspond to the selectors 39a to 39c.

Figure 4:
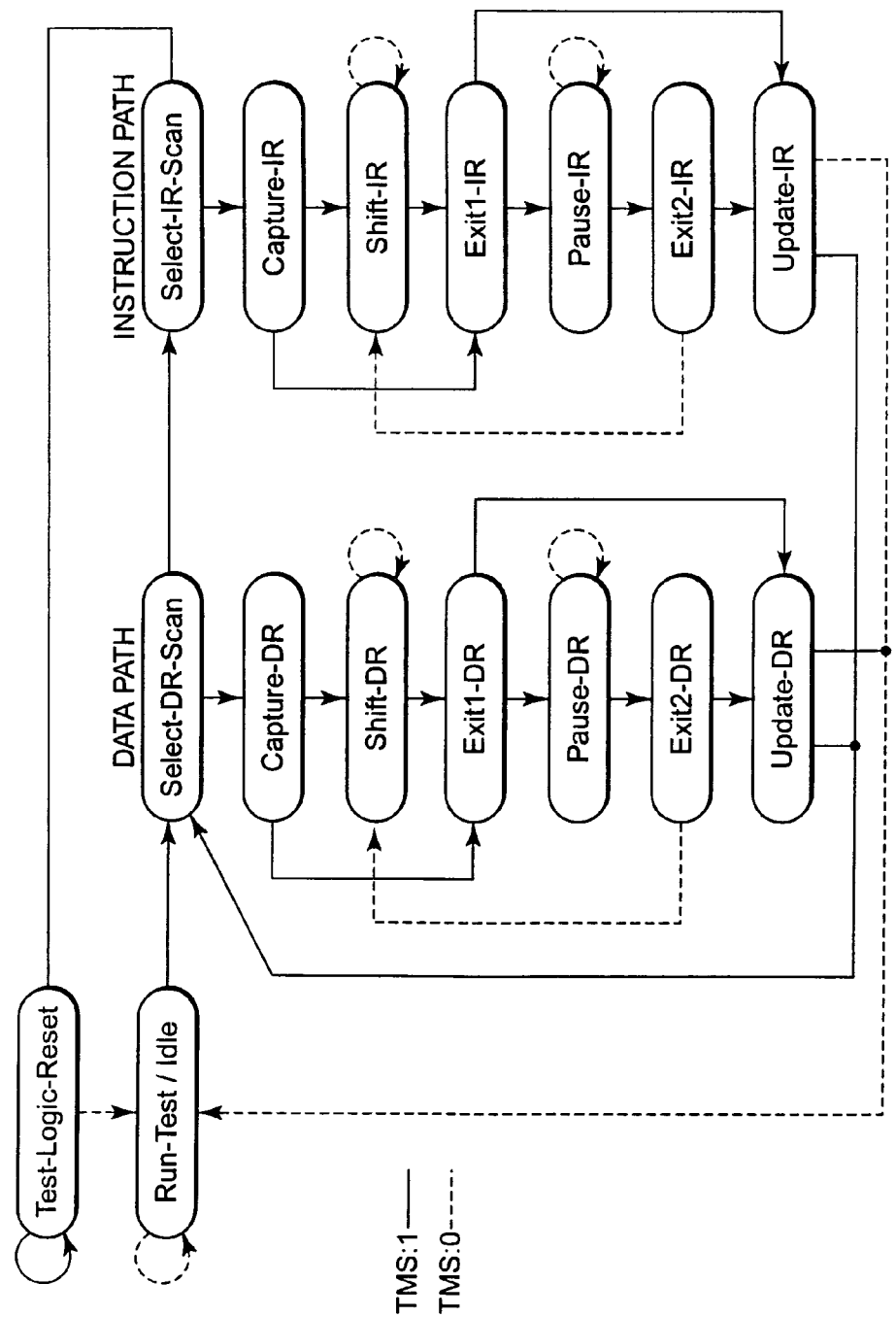
FIG. 4 is a state transition diagram of a state machine according to the first exemplary embodiment.

The operation of a TAP controller will now be described. A TAP controller includes a state machine (not shown) in a TAP core. The TAP controller causes the state machine to transition among possible states using a TMS signal and a TCK signal, thereby testing a circuit to be tested. FIG. 4 shows a state transition diagram of a state machine.

As shown in FIG. 4, the state machine transitions from one state to another according to the signal level of a TMS signal when the rising edge of a TCK signal is inputted. States will be described hereinafter. Test-Logic-Reset is a reset state for the state machine, and a test circuit has no effect on other circuits in this state. Note that if a TRST signal is set to low level, then the state machine can transition from any state to the Test-Logic-Reset state. Run-Test-Idle is a state indicating a state ready for testing or a passing state following the Test-Logic-Reset state.

Select-IR-Scan is a temporary state for selecting a state in which an instruction register IR is controlled. Capture-IR is a state in which preparations to input a control code inputted from a TDI port to the instruction register IR are made. Shift-IR is a state in which a control code is shifted on every rising edge of the TCK signal, and the control code is set in the instruction register IR. Exit1-IR is a state in which a selection is made between transitioning to a Pause-IR state and transitioning to an Update-IR state after finishing the Shift-IR state. Pause-IR is a state in which shift operation of the instruction register IR is temporarily stopped. Exit2-IR is a state in which a selection is made between returning to the Shift-IR state and advancing to the Update-IR state. Update-IR is a state in which the control code set in the instruction register IR is executed on the falling edge of the TCK signal.

Select-DR-Scan is a temporary state for selecting a state in which a boundary scan register BS is controlled. Capture-DR is a state in which preparations to input a control code inputted from the TDI port to the boundary scan register BS are made, and a test result obtained from a circuit to be tested is set in the boundary scan register BS. Shift-DR is a state in which a value in the boundary scan register BS is shifted on every rising edge of the TCK signal, and a control code inputted from the TDI port is newly set in the boundary scan register BS while the test result stored in the boundary scan register BS is outputted. Exit1-DR is a state in which a selection is made between transitioning to a Pause-DR state and transitioning to an Update-DR state after finishing the Shift-DR state. Pause-DR is a state in which shift operation of the boundary scan register BS is temporarily stopped. Exit2-DR is a state in which a selection is made between returning to the Shift-DR state and advancing to the Update-DR state. Update-DR is a state in which the control code set in the boundary scan register BS is supplied to the circuit to be tested on the falling edge of the TCK signal.

The operation of a test circuit according to the exemplary embodiment will be described next. The test circuit can perform three tests according to the states of the operation mode setting signal MODE and the shift mode signal SFT. A first test mode is a parallel test mode in which the plurality of TAP controllers are all made to operate in accordance with the same control code and the same test control signals. A second test mode is a chip batch test mode in which the boundary scan registers BS of the plurality of TAP controllers are series-connected, and a plurality of circuits to be tested (corresponding to, e.g., one chip) are tested using one test pattern. A third test mode is a per-core test mode in which the plurality of TAP controllers are treated as independent TAP controllers. Note that values in the CSP registers are assumed to be all valid in the following description, and a description of the operation when the CSP registers have different values will be omitted. Since the second slave TAP controller 40 operates in substantially the same manner as the first slave TAP controller 20, a block diagram of a part corresponding to the second slave TAP controller 40 shown in FIG. 3 will be omitted in the following description.

In the following description, each TAP core of the test circuit in the Test-Logic-Reset state is assumed to receive a control code and test control signals from the group of common test ports. The operation mode setting signal MODE and the shift mode signal SFT are assumed to be set according to a control code inputted to the instruction registers IR before the start of testing.

Figure 5:
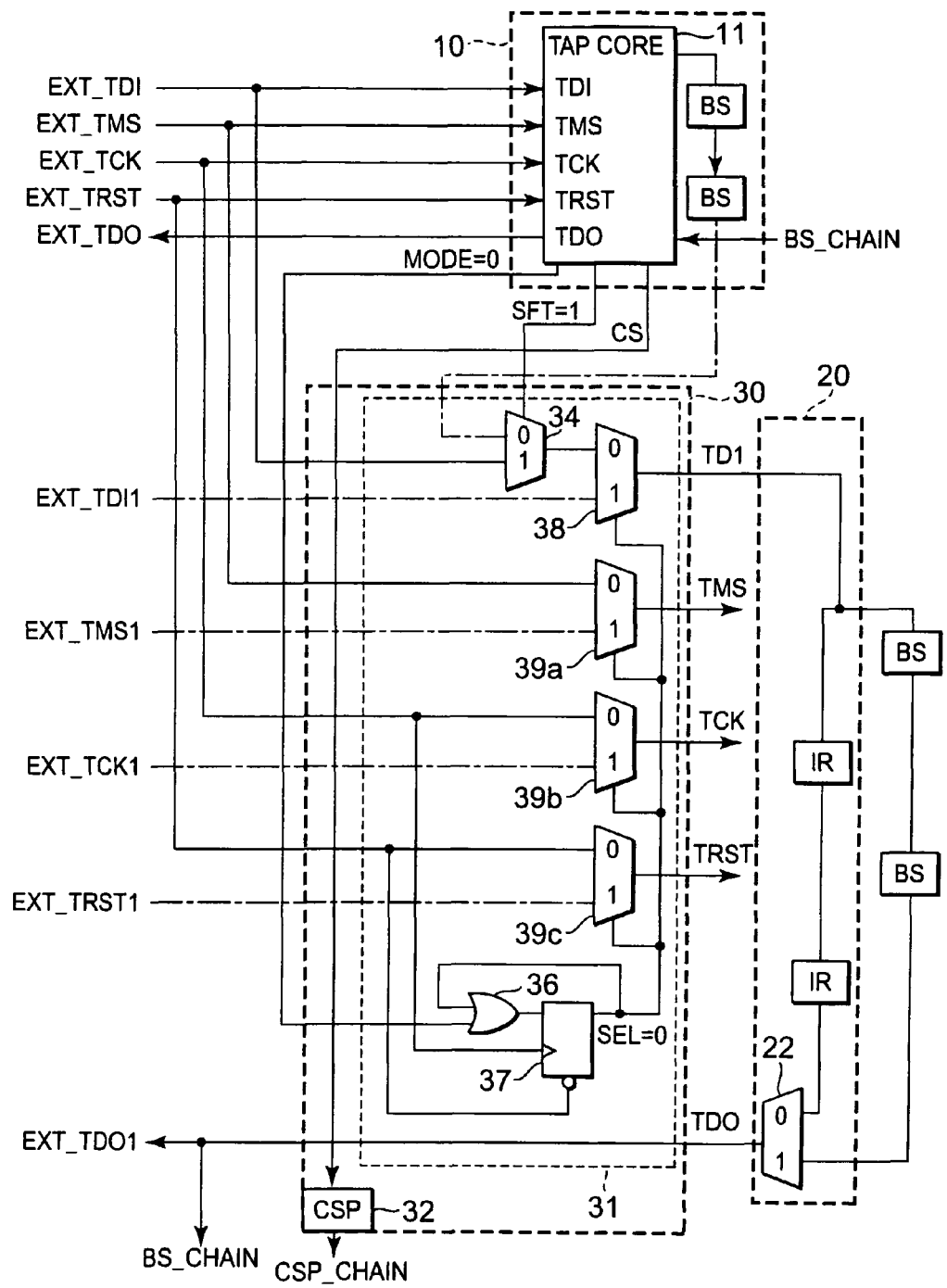
FIG. 5 is a block diagram of the test circuit according to the first exemplary embodiment showing a signal path which is enabled when the test circuit runs in a parallel test mode.

FIG. 5 shows a diagram showing signal wires of the test circuit which are enabled when the test circuit runs in the parallel test mode. In FIG. 5, an enabled signal wire is indicated by a solid line, and a disabled signal wire is indicated by an alternate long and short dash line. In the parallel test mode, the operation mode setting signal MODE is "0" while the shift mode signal SFT is "1." The input switching signal SEL is set to "0" to correspond to the value of the operation mode setting signal MODE.

For this reason, in the parallel test mode, the TAP pin control circuits 31 and 51 supply a control code (e.g., a test pattern) and test control signals inputted from the group of common test ports to the first slave TAP controller 20 and the second slave TAP controller 40.

With this operation, the same test pattern is set in the boundary scan registers BS, and the first slave TAP controller 20 and the second slave TAP controller 40 operate on the basis of the same test control signals. That is, the TAP controllers perform the same test in the parallel test mode. Results of the test performed in the TAP controllers are outputted from the TDO ports provided for the TAP controllers (the EXT_TDO port, the EXT_TDO1 port, and the EXT_TDO2 port). Note that since the master TAP controller 10 operates in the same manner as the first slave TAP controller 20 and the second slave TAP controller 40 in the parallel test mode, the test can also be performed using the master TAP controller 10.

Figure 6:
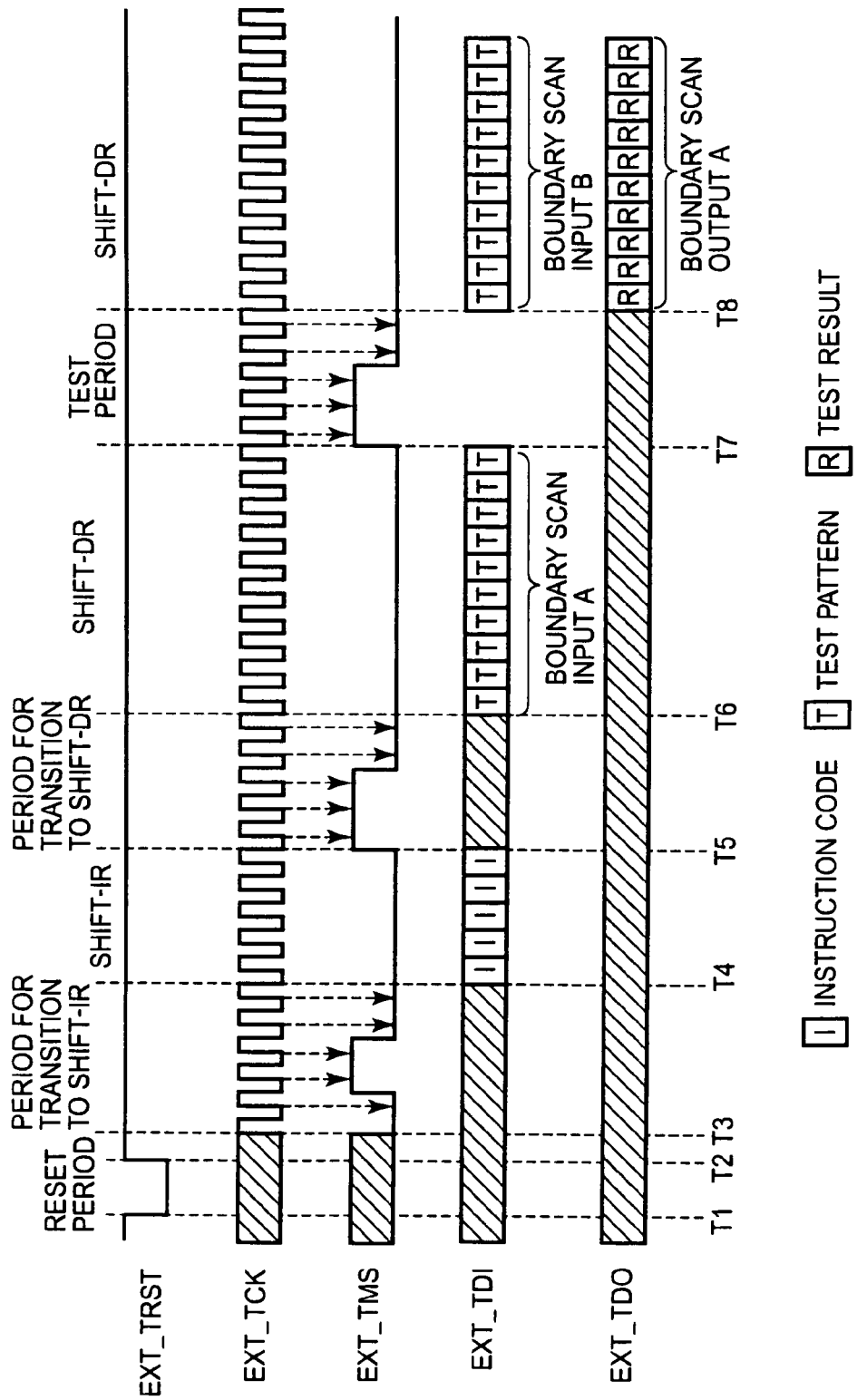
FIG. 6 is a timing chart for the test circuit according to the first exemplary embodiment when the test circuit runs in the parallel test mode.

FIG. 6 shows a timing chart showing the operation of the test circuit when the test circuit runs in the parallel test mode. In the parallel test mode, the TRST signal is at low level during a period from time T1 to time T2, and each state machine is put in the Test-Logic-Reset state, as shown in FIG. 6. The TCK signal and the TMS signal then start being inputted at time T3, and the state machine transitions to the Shift-IR state at time T4. A control code (e.g., an instruction code) is supplied as the TDI signal during a period from time T4 to time T5. The state machine is then made to transition to the Shift-DR state during a period from time T5 to time T6. In the Shift-DR state, shift operation of the control code (e.g., a test pattern) is performed during a period from time T6 to time T7, and the test pattern is set in the boundary scan registers BS.

The state machine enters the Update-DR state at a time during a period from time T7 to time T8, and a test is performed. After that, the state machine is made to transition back to the Shift-DR state during the period from time T7 to time T8. In this case, a pattern serving as a test result is stored in the boundary scan registers BS at time T8. For this reason, during a period from time T8 corresponding to the Shift-DR state, a test result is outputted while a new test pattern is inputted.

Figure 7:
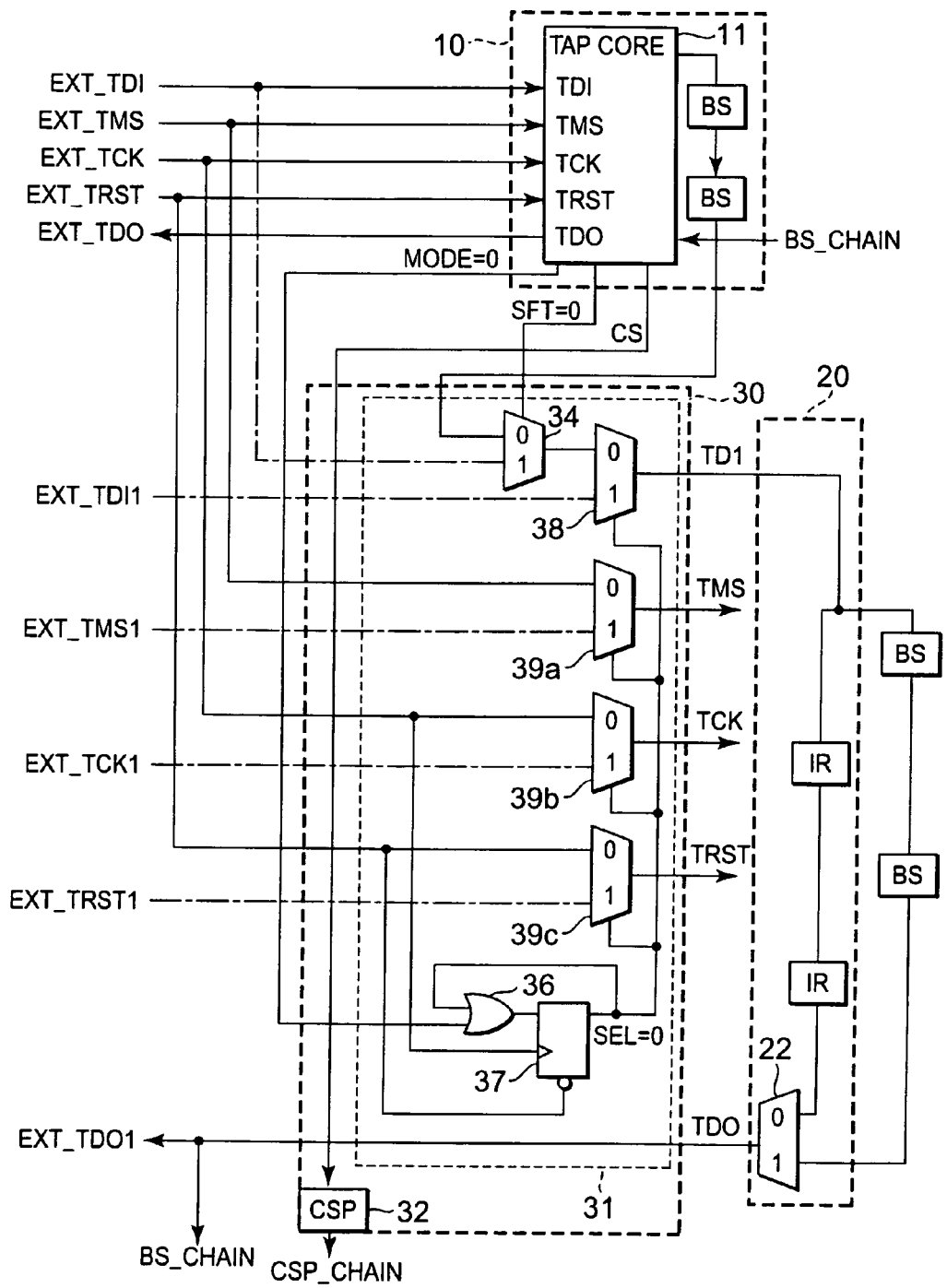
FIG. 7 is a block diagram of the test circuit according to the first exemplary embodiment showing a signal path which is enabled when the test circuit runs in a chip batch test mode.

FIG. 7 shows a diagram showing signal wires of the test circuit which are enabled when the test circuit runs in the chip batch test mode. In FIG. 7, an enabled signal wire is indicated by a solid line, and a disabled signal wire is indicated by an alternate long and short dash line. In the chip batch test mode, the operation mode setting signal MODE is "0" while the shift mode signal SFT is "0." The input switching signal SEL is set to "0" to correspond to the value of the operation mode setting signal MODE.

For this reason, in the chip batch test mode, the TAP pin control circuits 31 and 51 supply the test control signals inputted from the group of common test ports to the first slave TAP controller 20 and the second slave TAP controller 40. In the chip batch test mode, the TAP pin control circuits 31 and 51 receive a control code (e.g., a test pattern) through a boundary scan chain of the TAP controller arranged at a previous stage and supplies the control code to the first slave TAP controller 20 and the second slave TAP controller 40.

With this operation, the first slave TAP controller 20 and the second slave TAP controller 40 operate on the basis of the same set of test control signals. As for the boundary scan registers BS, the boundary scan registers BS belonging to the plurality of TAP controllers constitute one boundary scan chain. That is, one test on a plurality of circuits to be tested is performed by the plurality of TAP controllers in the chip batch test mode.

Note that since the plurality of TAP controllers including the master TAP controller 10 constitute one boundary scan chain in the chip batch test mode, an output signal (the TDO signal) from one arranged at the last stage of the plurality of TAP controllers is outputted as a test result through the master TAP controller 10.

A timing chart showing the operation of the test circuit when the test circuit runs in the chip batch test mode is obtained by lengthening each of the period from time T6 to time T7 and the period from time T8 when a test pattern is inputted in the timing chart for the parallel test mode shown in FIG. 6. That is, the timing chart in the chip batch test mode is substantially the same as that in the parallel test mode.

Figure 8:
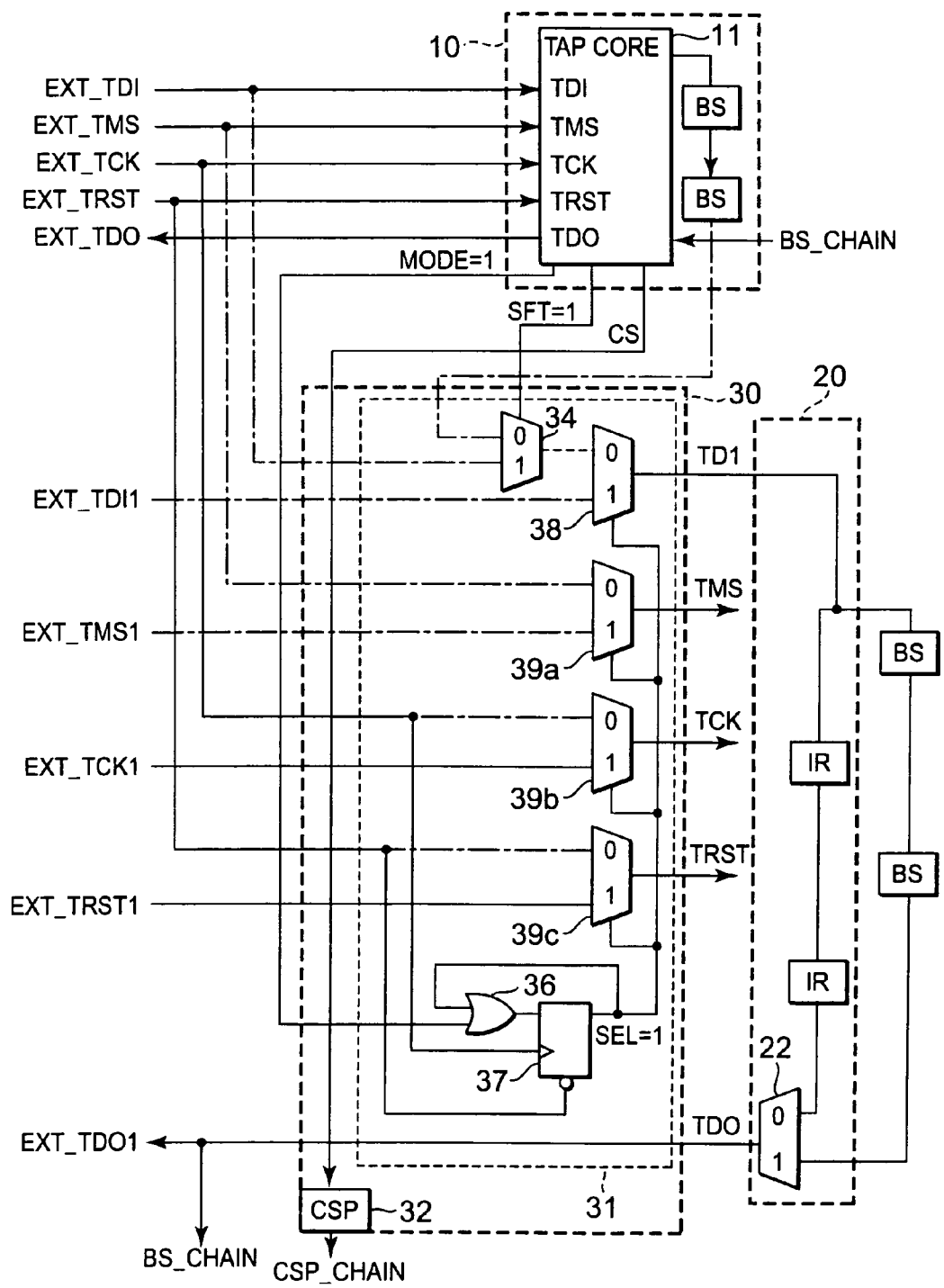
FIG. 8 is a block diagram of the test circuit according to the first exemplary embodiment showing a signal path which is enabled when the test circuit runs in a per-core test mode.

FIG. 8 shows a diagram showing signal wires of the test circuit which are enabled when the test circuit runs in the per-core test mode. In FIG. 8, an enabled signal wire is indicated by a solid line, and a disabled signal wire is indicated by an alternate long and short dash line. In the per-core test mode, the operation mode setting signal MODE is "1" while the shift mode signal SFT may be "0" or "1." The input switching signal SEL is set to "1" to correspond to the value of the operation mode setting signal MODE.

For this reason, in the per-core test mode, the TAP pin control circuits 31 and 51 supply a control code (e.g., a test pattern) and test control signals inputted from the group of first individual test ports and the group of second individual test ports to the first slave TAP controller 20 and the second slave TAP controller 40.

With this operation, the first slave TAP controller 20 and the second slave TAP controller 40 each operate independently of the other on the basis of the signals inputted from the corresponding group of individual test ports. That is, in the per-core test mode, the TAP controllers perform independent tests. Results of the tests performed in the TAP controllers are outputted from the TDO ports provided for the TAP controllers (the EXT_TDO port, the EXT_TDO1 port, and the EXT_TDO2 port). Note that the master TAP controller 10 can be made to operate independently in the same manner as the first slave TAP controller 20 and the second slave TAP controller 40 in the per-core test mode.

FIG. 9 shows a timing chart showing the operation of the test circuit when the test circuit runs in the per-core test mode. In the per-core test mode, all the TAP controllers operate in the same manner on the basis of a control code and test control signals inputted from the group of common test ports during a period from time T11 to time T16, as shown in FIG. 9. In the per-core test mode, the control code and the test control signals are inputted during a period from time T14 to time T15. When operation based on an instruction code inputted during the period from time T14 to time T15 is performed at time T16, the operation mode setting signal MODE is set to "1" in accordance with the instruction code. This allows each of the TAP pin control circuits 31 and 51 to receive a control code and test control signals inputted from the corresponding group of individual test ports.

For this reason, an operation of putting the state machine back into the Test-Logic-Idle state and an operation of shifting the state machines to the Shift-DR state are performed for the main TAP controller 10 and the slave TAP controllers, respectively, independently of each other after time T16.

When each slave TAP controller enters the Shift-DR state after time T16, shift operation of the control code (e.g., a test pattern) is performed during a period from time T18 to time T19, and the test pattern is set in the boundary scan registers BS. The state machine enters the Update-DR state at a time during a period from time T19 to time T20, and a test is performed. After that, the state machine is made to transition back to the Shift-DR state during the period from time T19 to time T20. In this case, a pattern serving as a test result is stored in the boundary scan registers BS at time T20. For this reason, during a period from time T20 corresponding to the Shift-DR state, a test result is outputted while a new test pattern is inputted.

As can be seen from the above description, the master TAP controller outputs the shift mode signal SFT, and each port control circuit switches between inputting a control code to be inputted to the slave TAP controller from the outside and inputting a control code through the master TAP controller. With this configuration, the test circuit is capable of switching between treating the boundary scan chains in the plurality of TAP controllers as one scan chain (chip batch test mode) and treating the boundary scan chains as individual scan chains (parallel test mode or per-core test mode). That is, it is possible to switch the range of circuits to be tested included in testing. For this reason, the test circuit according to the present invention can make the flexibility in testing higher than a related test circuit.

The test circuit according to the exemplary embodiment is also capable of switching between making the plurality of TAP controllers operate in parallel (parallel test mode) and making the plurality of TAP controllers operate individually (per-core test mode) using the operation mode setting signal MODE. Since the test circuit can make the plurality of TAP controllers operate in parallel in the parallel test mode, it can test circuits to be tested which are to be subjected to the same test at one time. This allows a reduction in test time. Since the test circuit can make the plurality of TAP controllers operate independently of each other in the per-core test mode, it can perform, e.g., tests at different operating frequencies for each of the TAP controllers.

In other words, the test circuit according to the exemplary embodiment is capable of changing a unit for TAP controllers to be controlled using the shift mode signal SFT and the operation mode setting signal MODE and achieving an increase in the flexibility in testing and a reduction in test time.

Note that the present invention is not limited to the above-described exemplary embodiment, and appropriate changes may be made in the scope that does not depart from the spirit of the invention. For example, the logic of the operation mode setting signal MODE and that of the shift mode signal SFT can be appropriately changed depending on the input selection logic of each TAP pin control circuit.

Further, it is noted that Applicant's intent is to encompass equivalents of all claim elements, even if amended later during prosecution.

What is claimed is:

1. A test circuit which comprises a plurality of test access port (TAP) controllers conforming to a standard specification defined in IEEE 1149, comprising:
- a master TAP controller which receives a control code and a test control signal and performs a test on a circuit to be tested and which outputs a shift mode signal;
- a slave TAP controller which receives the control code and the test control signal and performs a test on a circuit to be tested; and
- a TAP pin control circuit provided to correspond to the slave TAP controller and which supplies the control code to the slave TAP controller, by switching receiving the control code from an external port or receiving the control code from the master TAP controller, on a basis of the shift mode signal.

2. The test circuit according to claim 1, wherein the TAP pin control circuit comprises a data path switching circuit which includes one port connected to a common code input port included in a group of common test ports provided to correspond to the master TAP controller and the slave TAP controller, and an other port connected to an output of a boundary scan register provided in the master TAP controller, and
- wherein the data path switching circuit selects the control code inputted from one of the one port and the other port according to the shift mode signal and outputs the selected one to the slave TAP controller.

3. The test circuit according to claim 2, wherein the master TAP controller receives the control code and the test control signal and outputs an operation mode setting signal and
- wherein the TAP pin control circuit switches between inputting the test control signal to be inputted to the slave TAP controller from the group of common test ports and inputting the test control signal from a group of first individual test ports provided to correspond to the slave TAP controller, on a basis of the operation mode setting signal.

4. The test circuit according to claim 3, wherein the TAP pin control circuit comprises:
- a mode control circuit which holds a value of the operation mode setting signal and outputs the held value as an input switching signal; and
- a code input switching circuit which selects and outputs one of the control code outputted by the data path switching circuit and the control code inputted from a TDI port included in the group of first individual test ports according to the input switching signal.

5. The test circuit according to claim 4, wherein the TAP pin control circuit selects and outputs one of the test control signal inputted from the common test ports and the test control signal inputted from the group of first individual test ports according to the input switching signal.

6. The test circuit according to claim 1, wherein the slave TAP controller comprises a first slave TAP controller, the test circuit further comprising:
- a port controller circuit;
- a second slave TAP controller which receives the control code and the test control signal and performs is a test on a circuit to be tested; and
- a second TAP pin control circuit provided to correspond to the second slave TAP controller and which switches between inputting the control code to be inputted to the second slave TAP controller from outside and inputting the control code through the first slave TAP controller, on a basis of the shift mode signal.

7. The test circuit according to claim 6, further comprising a data path switching circuit that comprises a first data path switching circuit,
- wherein the second TAP pin control circuit comprises a second data path switching circuit which includes one port connected to a common code input port included in a group of common test ports provided to correspond to the master TAP controller and the second slave TAP controller, and includes an other port connected to an output of a boundary scan register provided in the first slave TAP controller, and
- wherein the second data path switching circuit selects the control code inputted from one of the one port and the other port according to the shift mode signal, and outputs the selected one to the second slave TAP controller.

8. The test circuit according to claim 7, wherein the master TAP controller receives the control code and the test control signal and outputs an operation mode setting signal and
- wherein the second TAP pin control circuit switches between inputting the test control signal to be inputted to the second slave TAP controller from the group of common test ports and inputting the test control signal from a group of second individual test ports provided to correspond to the second slave TAP controller, on the basis of the operation mode setting signal.

9. The test circuit according to claim 8, wherein the second TAP pin control circuit comprises:
- a second mode control circuit which holds a value of the operation mode setting signal and outputs the held value as an input switching signal; and
- a second code input switching circuit which selects and outputs one of the control code outputted by the second data path switching circuit and the control code inputted from a TDI port included in the group of second individual test ports according to the input switching signal.

10. The test circuit according to claim 9, wherein the second TAP pin control circuit selects and outputs one of the test control signal inputted from the common test ports and the test control signal inputted from the group of second individual test ports according to the input switching signal.

11. A test circuit, comprising:
- a master test access port (TAP) controller conforming to a standard specification defined in IEEE 1149, which receives a first test code and outputs a first test signal to be stored in a first boundary scan register, a mode setting signal and a shift mode signal;
- a first TAP pin control circuit which receives the first test code, a second test code and the first test signal, and selectively outputs one of the first test code, the second test code and the first test signal, based on the mode setting signal and the shift mode signal, the first TAP pin control circuit further outputting a second test signal to be stored in a second boundary scan register;
- a first slave TAP controller which receives an output from the first TAP pin control circuit;
- a second TAP pin control circuit which receives the first test code, a third test code and the second test signal, and selectively outputs one of the first test code, the third test code and the second test signal, based on the mode setting signal and the shift mode signal; and
- a second slave TAP controller which receives an output from the second TAP pin control circuit.

12. A test circuit, comprising:
- a master test access port (TAP) controller conforming to a standard specification defined in IEEE 1149, which receives a test code and outputs a test signal to be stored in a boundary scan register and a shift mode signal;
- a TAP pin-control circuit which receives the test code and the test signal, and selectively outputs one of the test code and the test signal, based on the shift mode signal; and
- a slave TAP controller which receives an output from the TAP pin-control circuit.

* * * * *